United States Patent
Dambournet et al.

(10) Patent No.: US 10,680,241 B2
(45) Date of Patent: Jun. 9, 2020

(54) NANOMETRIC ANATASE LATTICE STABILISED BY CATION VACANCIES, METHODS FOR THE PRODUCTION THEREOF, AND USES OF SAME

(71) Applicants: HYDRO-QUÉBEC, Montréal, Québec (CA); UNIVERSITÉ PIERRE ET MARIE CURIE (PARIS 6), Paris (FR); CENTRE NATIONAL DE LA RECHERCHE SCIENTIFIQUE, Paris (FR)

(72) Inventors: Damien Dambournet, Paris (FR); Wei Li, Paris (FR); Henri Groult, Paris (FR); Sandrine Leclerc, Paris (FR); Christian Julien, Paris (FR); Karim Zaghib, Longueuil (CA)

(73) Assignees: HYDRO-QUEBEC, Montreal, Quebec (CA); UNIVERSITE PIERRE ET MARIE CURIE (PARIS 6), Paris (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 317 days.

(21) Appl. No.: 15/528,140

(22) PCT Filed: Nov. 20, 2015

(86) PCT No.: PCT/CA2015/051215
§ 371 (c)(1),
(2) Date: May 19, 2017

(87) PCT Pub. No.: WO2016/077933
PCT Pub. Date: May 26, 2016

(65) Prior Publication Data
US 2018/0277840 A1    Sep. 27, 2018

Related U.S. Application Data

(60) Provisional application No. 62/082,345, filed on Nov. 20, 2014.

(51) Int. Cl.
   *H01M 4/485*    (2010.01)
   *C30B 7/14*    (2006.01)
   (Continued)

(52) U.S. Cl.
   CPC ............ *H01M 4/485* (2013.01); *C01G 23/00* (2013.01); *C01G 23/002* (2013.01); *C30B 7/14* (2013.01);
   (Continued)

(58) Field of Classification Search
   None
   See application file for complete search history.

(56) References Cited

U.S. PATENT DOCUMENTS 5,597,515 A * 1/1997 Kauffman .............. B82Y 30/00
                                                                252/519.12
2014/0093779 A1    4/2014 Myung et al.
2014/0306215 A1* 10/2014 Baker ............... H01L 21/02565
                                                                  257/43

FOREIGN PATENT DOCUMENTS

| JP | 2012512329 A | 5/2012 |
| JP | 2012234746 A | 11/2012 |
| WO | 2010069906 A1 | 6/2010 |

OTHER PUBLICATIONS

Mori, K. et al."Hydrothermal synthesis of TiO2 photocatalysts in the presence of NH4F and their application for degradation of organic compounds" Elsevier, Chemical Engineering Science, vol. 63, pp. 5066-5070, 2008.
(Continued)

*Primary Examiner* — William D Young
(74) *Attorney, Agent, or Firm* — Buchanan Ingersoll & Rooney P.C.

(57) ABSTRACT

The present application describes a process for the preparation of titanium-based compounds having an anatase type
(Continued)

structure with cationic vacancies arising from a partial substitution of oxygen atoms by fluorine atoms and hydroxyl groups. Electrochemically active materials comprising the titanium-based compounds for use in lithium-ion battery electrodes are also described.

18 Claims, 4 Drawing Sheets

(51) Int. Cl.
| | |
|---|---|
| *C30B 29/16* | (2006.01) |
| *H01M 4/1315* | (2010.01) |
| *C30B 29/10* | (2006.01) |
| *C30B 29/60* | (2006.01) |
| *C01G 23/00* | (2006.01) |
| *C30B 29/64* | (2006.01) |
| *H01M 10/0525* | (2010.01) |
| *H01M 10/052* | (2010.01) |

(52) U.S. Cl.
CPC .............. *C30B 29/10* (2013.01); *C30B 29/16* (2013.01); *C30B 29/60* (2013.01); *C30B 29/64* (2013.01); *H01M 4/1315* (2013.01); *H01M 10/0525* (2013.01); *C01P 2002/72* (2013.01); *C01P 2002/85* (2013.01); *C01P 2002/86* (2013.01); *C01P 2004/04* (2013.01); *C01P 2006/40* (2013.01); *H01M 10/052* (2013.01)

(56) References Cited

OTHER PUBLICATIONS

Ye, M. et al."Effect of key parameters on the morphology transformation of three-dimensional TiO2 solid microspheres" Materials Letters, vol. 65, pp. 363-366, 2011.
Yu, J. et al."The effect of F-doping and temperature on the structural and textural evolution of mesoporous TiO2 powders" Journal of Solid State Chemistry, vol. 174, pp. 372-380, 2003.
Jung, H. et al."Mesoporous Anatase TiO2 with High Surface Area and Controllable Pore Size by F-Ion Doping: Applications for High-Power Li-Ion Battery Anode" J. Phys. Chem. C. vol. 113, No. 50, pp. 21258-21263, 2009.
Extended European Search Report dated May 3, 2018, issued by the European Patent Office in corresponding European Application No. 15861644.1-1106. (10 pages).
Tosoni S. et al."Electronic Structure of F-Doped Bulk Rutile, Anatase, and Brookite Polymorphs of TiO2" The journal of Physical Chemistry, vol. 116, No. 23, pp. 12738-12746, May 23, 2012.
Li W. et al."High Substitution Rate in TiO2 Anatase Nanoparticles with Cationic Vacancies for Fast Lithium Storage" Chemistry of Materials, DOI: 0.1021/acs.chemmater.5b01407, Published online, Jun. 24, 2015, 6 Pages (A-F).
Corradini D. et al."Tuning the Electronic Structure of Anatase Through Fluorination" Scientific Reports, vol. 5, No. 11553: doi: 10.1038/srep 11553, Published : Jun. 26, 2015, pp. 1-8.
Ma J. et al."Influence of Controlling Titanium Vacancies on Electrochemical Properties of Fluorinated Ti-based Anatase" Journees Annuelles de la SF2m 2015 JA2015, Materiaux et Conversion d'energie, Oct. 26-28, 2015, a Chimie Paris Tech Paris, 2 Pages.
Yu J. C. et al."Effects of F-Doping on the Photocatalytic Activity and Microstructures of Nanocrystalline TiO2 Powders" Chem. Mater. vol. 14, No. 9, pp. 3808-3816, 2002.
Yang H. G. et al."Anatase TiO2 single crystals with a large percentage of reactive facets" Nature, vol. 453, pp. 638-642, May 29, 2008.
Pighini C."Syntheses de nanocristaux de TiO2 anatase a distribution de taille controlee" Universite De Bourgogne, Version Mar. 2-13, 2007, 206 Pages. (With Partial Machine Translation).
Su X. et al."Advanced titania nanostructures and composites for lithium ion battery" J Mater Sci, vol. 47, pp. 2519-2534, 2012.
French Search Report (Form PCT/ISA/210), dated Feb. 5, 2016 by the Office de la propriete intellectuelle du Canada in corresponding Canadian Application No. PCT/CA2015/051215, (4 pages).
International Preliminary Report on Patentability (Form PCT/IB/373) and the Written Opinion of the International Searching Authority (Form PCT/ISA/237) dated May 2, 2017, by the Bureau international de l'OMPI, in corresponding International Application No. PCT/CA2015/051215 (11 pages).
Demourgues, A. et al."About MX3 and MX2 (Mn+=Mg2+, Al3+_ Ti4+, Fe3+: XP-=F-, 0 2-,_ OH-) nanofluorides" Elsevier, Journal of Fluorine Chemistry, 2012, vol. 134, pp. 35-43.
Office Action (Notice of Reasons for Rejection) dated Apr. 23, 2019, by the Japanese Patent Office in corresponding Japanese Patent Application No. 2017-525838, and an English Translation of the Office Action. (15 pages).

\* cited by examiner

NANOMETRIC ANATASE LATTICE STABILISED BY CATION VACANCIES, METHODS FOR THE PRODUCTION THEREOF, AND USES OF SAME

PRIORITY APPLICATION

The present application claims priority, under the applicable law, from the U.S. provisional application No. 62/082,345 filed on Nov. 20, 2014, the content of which is incorporated herein by reference in its entirety for all purposes.

FIELD OF THE INVENTION

The invention relates to a chemical process which allows for the preparation of nanosized anatase particles containing a controllable amount of cationic vacancies through partial substitution of oxygen by fluorine atoms and/or hydroxyl groups, and their uses in lithium batteries electrodes.

BACKGROUND OF THE INVENTION

Energy supply is one of the biggest challenges of the $21^{st}$ century. Concomitant climate changes and limited future fossil-fuel supplies push towards the use of clean energy sources. Electrochemical energy storage is predicted to play a major role in the decarbonization of our energy. Batteries, which are electrochemical devices capable of storing energy through electrochemical reactions, are considered as one of the most promising technologies in response to future societal challenges such as electric transportation and stationary energy storage systems which can be used, for instance, as support for wind or solar sources.

With respect to negative electrodes, the use of carbonaceous electrodes is limited due to safety concerns and poor rate capability. To the opposite, titanium-based compounds are considered as strong candidates for safe negative electrodes in lithium batteries. Indeed, the operating voltage of this class of materials lies within the electrolyte stability region, i.e. >0.8V. This confers improved safety features to the battery, together with the desired absence of thermally unstable Solid-Electrolyte-Interface (SEI) layer as well as lithium plating on the anode.

Another interesting feature of titanium-based compounds is their ability to sustain high discharge/charge rates, which is required for high power applications such as electric vehicles. One approach commonly used to achieve enhanced rate capability is the reduction of particles size. A complementary approach comprises the modification of the structural arrangement through ionic substitutions.

Within the titanium dioxide family, the anatase (tetragonal, space group: $I4_1/amd$) form has been widely investigated due to its peculiar properties. Based upon the $Ti^{4+}/Ti^{3+}$ redox couple, a capacity of 335 mAh/g can be achieved. The anatase structure is built from $TiO_6$ octahedra units linked through edge-sharing. This three-dimensional structure displays vacant sites suitable for lithium intercalation proceeding via a reversible first-order transition, i.e. from a tetragonal to an orthorhombic system. This phase transition behavior is characterized by a plateau region in the potential-capacity curve. Nevertheless, a solid solution property over the complete lithium composition range is preferred for practical applications. Indeed, this generally allows to avoid a nucleation process at high rate and an easier monitoring of the state of charge of the battery as compare to first-order transition materials.

SUMMARY OF THE INVENTION

According to one aspect, the invention relates to a method for preparing a titanium-based compound having an anatase type structure with cationic vacancies arising from a partial substitution of oxygen atom(s) by fluorine atom(s) and hydroxyl group(s). For instance, the method comprises the steps of:

a) preparation of a solution containing a titanium precursor, a fluorinating agent and a solvent; and b) precipitation of a titanium-based compound having the general chemical formula $Ti_{1-x-y}\square_{x+y}F_{4x}(OH)_{4y}O_{2-4(x+y)}$, where $\square$ represents a cationic vacancy and wherein x and y are numbers such that $0.01 \leq (x+y) < 0.5$, or such that $0.04 \leq (x+y) < 0.5$.

In one embodiment, the titanium precursor is selected from titanium $C_2$-$C_{10}$alkoxides and titanium tetrachloride. In another embodiment, the fluorinating agent is an agent which provides fluoride anions, preferably hydrogen fluoride (HF), ammonium fluoride ($NH_4F$), or ammonium hydrogen difluoride ($NH_4HF_2$). In a further embodiment, the solvent in the solution of step (a) is an organic solvent or a mixture of organic solvent and water, e.g. a mixture where the organic solvent is the major component, such as an organic solvent containing traces of water. For instance, the organic solvent is selected from $C_1$-$C_{10}$alcohols (like methanol, ethanol, isopropanol, butanol, and octanol), dialkylketones (e.g. acetone), ethers, esters or a combination thereof.

In one embodiment, step (b) of the method further comprises a thermal treatment (e.g. in a sealed container) which comprises, for instance, heating the solution of step (b) at a temperature within the range of from about 50° C. to about 220° C., or about 90° C. to about 160° C. According to one embodiment, the degree of cationic vacancies ($\square$) is controlled by adjusting the temperature of the thermal treatment.

The invention further relates to a titanium-based compound of the general chemical formula:

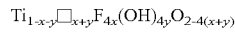

wherein, $\square$ represents a cationic vacancy; and x and y are numbers and respond to the formula $0.01 \leq (x+y) < 0.5$, or to the formula $0.04 \leq (x+y) < 0.5$.

In one embodiment, the titanium-based compound is prepared according to the process of the invention. In another embodiment, the titanium-based compound is $Ti_{0.78}\square_{0.22}F_{0.4}(OH)_{0.48}O_{1.12}$.

The invention also further relates to an electrochemically active material comprising a titanium-based compound prepared according to the process of the invention or a titanium-based compound as defined herein, to an electrode comprising the electrochemically active material and a current collector, and to lithium-ion batteries comprising the same.

Other features and advantages of the present invention will be better understood upon reading of the description herein below with reference to the appended drawings.

DETAILED DESCRIPTION

Figure 1:
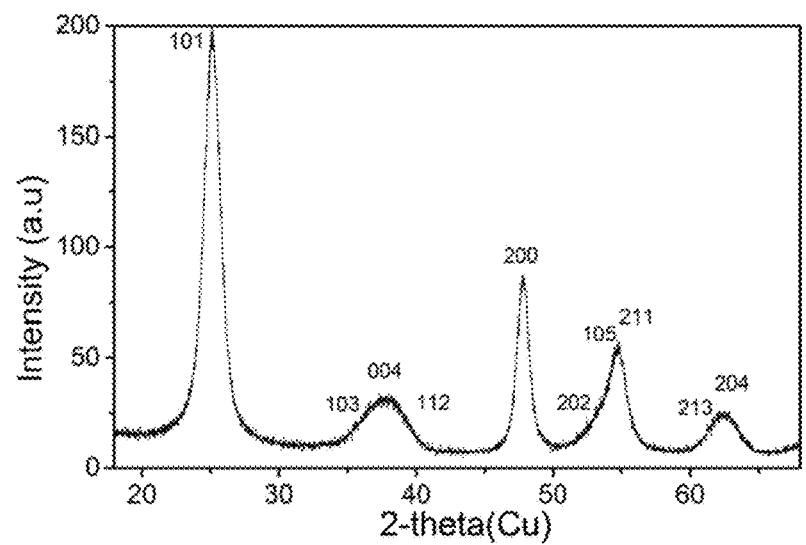
FIG. 1 shows an x-ray powder diffraction pattern of a phase prepared according to example 1. The pattern was indexed using the tetragonal symmetry, characteristic of the anatase network.

The present invention relates to methods for the preparation of titanium-based compounds having an anatase type structure with cationic vacancies arising from oxygen to fluorine/hydroxyl groups substitution. The degree of cationic vacancies can be controlled by the amount of fluorine/OH groups substituting oxygen within the anatase network. The general chemical formula of the compound prepared is $Ti_{1-x-y}\square_{x+y}F_{4x}(OH)_{4y}O_{2-4(x+y)}$, where $\square$ represents a cationic vacancy and x and y are such that their sum is between 0.01 and 0.5, or between 0.04 and 0.5, the upper limit being excluded.

The presence of cationic vacancies within the network provides additional vacant sites to host lithium ions and increase the ionic mobility, therefore potentially contributing to a higher energy/power density being achieved.

The invention further relates to electrochemical cells using the titanium-based compounds herein prepared, as electrode with structural arrangement/chemical formula that enables, a lithium storage mechanism contributing to a high power and a high-energy density which can be obtained. The modification of the structural arrangement through control of the chemical composition induces a variation in the electrochemical response when tested as negative electrode in lithium batteries. Indeed, the occurrence of cationic vacancies and fluorine atoms within the network induces a reversible solid solution behavior upon lithium intercalation as opposed to, the reversible first order transition observed for stoichiometric $TiO_2$ anatase. Additionally, a significant improvement in terms of rate capability, as compared to pure $TiO_2$, can be achieved with the present material, when used as electrode, being suitable for high power applications.

The present invention discloses the preparation of titanium-based compounds having an anatase type structure with cationic vacancies induced by partial oxygen substitution by fluorine and hydroxyl groups, and their uses in negative electrodes for lithium-ion batteries.

In some embodiments, this application describes a preparation method using, but not limited to, the following steps:

a) Preparation of a solution containing a titanium precursor and a fluorinating agent; and
b) Precipitation of a titanium-based compound having the general chemical formula $Ti_{1-x-y}\square_{x+y}O_{2-4(x+y)}F_{4x}(OH)_{4y}$, where $\square$ represents a cationic vacancy and wherein x and y are numbers such that $0.01 \leq (x+y) < 0.5$, or such that $0.04 \leq (x+y) < 0.5$ for instance, $0.1 \leq (x+y) < 0.3$ wherein x cannot be zero.

For example, the titanium precursor of step (a) is selected from titanium $C_2$-$C_{10}$ alkoxides and titanium chloride. For instance, the titanium $C_2$-$C_{10}$ alkoxide may be selected from titanium ethoxide, propoxide, isopropoxide and/or butoxide. The fluorinating agent is an agent acting as a source of fluoride anion including, without limitation, hydrogen fluoride (HF), ammonium fluoride ($NH_4F$), and ammonium hydrogen difluoride ($NH_4HF_2$). The fluorinating agent may be in the form of a solution, for example, an aqueous solution, e.g. a concentrated hydrofluoric acid solution. For example, the solvent used in the solution of step (a) is an organic solvent or a mixture of organic solvent and water. The organic solvent is selected from $C_1$-$C_{10}$ alcohols, dialkylketones (e.g. acetone), ethers and esters. Examples of $C_1$-$C_{10}$ alcohols include methanol, ethanol, isopropanol, butanol, and octanol.

In one embodiment, a solution containing a titanium alkoxide, an alcohol and a fluoride ion source is used. The molar ratio of fluoride and titanium ranges preferably from 0.1 to 4, preferably the molar ratio is 2.0. Typically, a solution containing titanium alkoxide, the fluoride and the organic solvent is prepared and then transferred in a sealed container, e.g. a Teflon®-lined sealed container. The sealed container is then placed in an oven and subjected to a temperature, for example, within the range of from about 50° C. to about 200° C., or from about 90° C. to about 160° C., or the temperature is set to about 90° C. The duration of the thermal treatment ranges preferably from one to 300 hours, preferably about 12 hours. After filtration, the precipitate is then washed and outgassed overnight, at a temperature ranging from 50 to 400° C. preferably at 150° C.

Several fluorinated anatase compounds, having different chemical compositions, were prepared for examples purposes by a preparation method according to the present application. For comparison purposes, a fluorine-free compound was prepared by thermally treating a fluorinated compound at 450° C. for 4 hours under air atmosphere.

EXAMPLES

The following non-limiting examples illustrate the invention. These examples and the invention will also be better understood with reference to the accompanying figures.

Example 1

A fluorinated anatase was obtained by treating a solution containing 13.5 mmol of titanium isopropoxide (4 mL) and 27 mmol of aqueous HF (40%) in 25 mL of isopropanol, in a sealed container at 90° C. for 12 hours. FIG. 1 presents the X-ray powder diffraction pattern (CuKα) recorded on the sample obtained according to this example. The corresponding pattern was indexed using the tetragonal structure with the I4$_1$/amd space group, which is characteristic of the anatase network. The sample is well crystallized and significant x-ray line broadening was observed indicating small coherence domains.

Figure 2A:
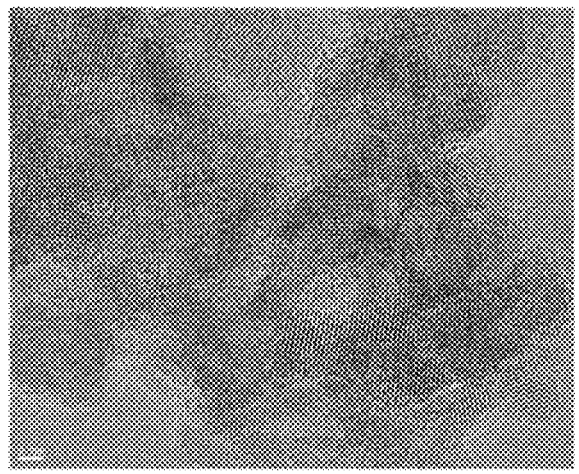
FIG. 2 shows a high-resolution transmission electron micrograph (TEM) obtained from the phase prepared according to example 1.
Figure 2B:
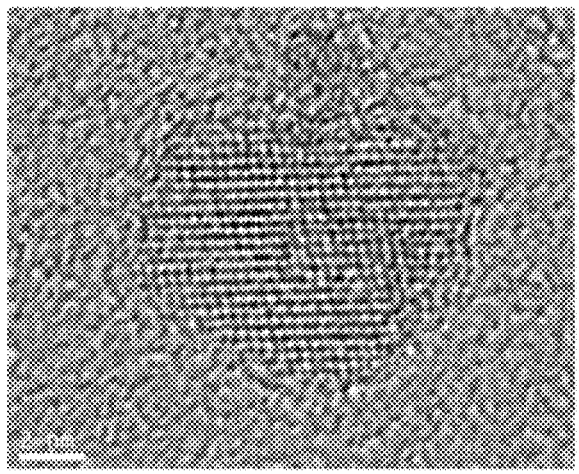

High-resolution transmission electron microscopy (FIG. 2) revealed that the morphology of the solid consists of agglomerates of particles whose size ranges from 5 to 8 nm. Additionally, hkl-dependent x-ray line broadening and HRTEM indicated the formation of faceted crystals, i.e. platelets, in agreement with a recent article (H. G. Yang et al., 2008, Nature, Vol. 453, pages 638-641) that highlights the role of fluorine atoms in stabilizing metastable surfaces. The specific surface area determined from nitrogen adsorption on the sample prepared according to this example was around 180 m$^2$/g.

Figure 3:
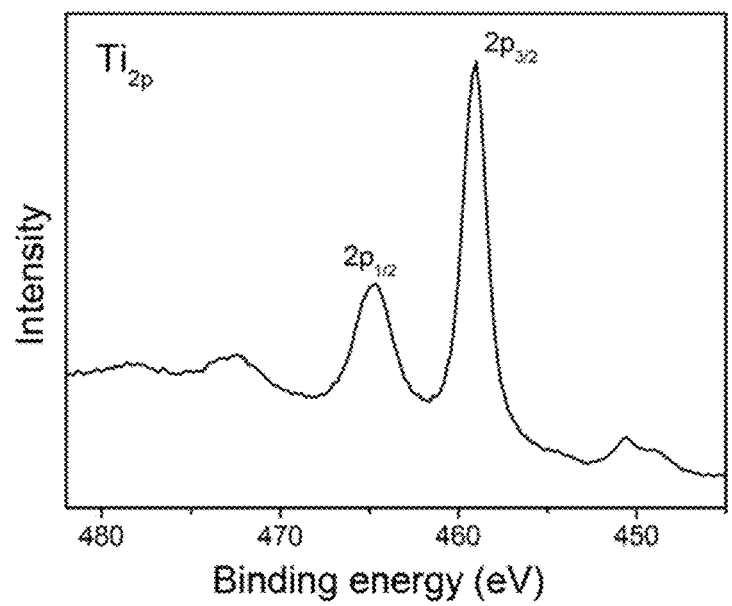
FIG. 3 shows the Ti2p XPS core spectrum obtained from the phase prepared according to example 1.

The oxidation state of titanium within the sample was determined using x-ray photo-electron spectroscopy. FIG. 3 represents the Ti2p XPS core spectra with the Ti2p$_{3/2}$ core located at 458.9 eV, characteristic of tetravalent titanium.

Figure 4:
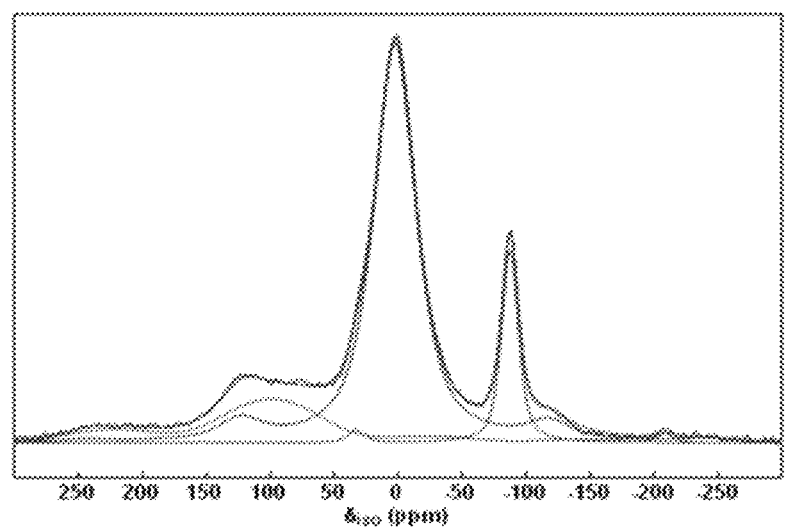
FIG. 4 shows a $^{19}$F Magic-Angle-Spinning NMR spectrum of the phase prepared according to example 1.

The fluorine atom content in the sample prepared was assessed using solid-state Nuclear Magnetic Resonance of the fluorine nucleus ($^{19}$F). The estimation of the F/Ti molar ratio was performed using a reference (NaF) and led to a ratio of 0.5. The chemical composition of the sample was Ti$_{0.78}$□$_{0.22}$F$_{0.4}$(OH)$_{0.48}$O$_{1.12}$. For information purposes, the three signals observed in the $^{19}$F MAS NMR spectra (FIG. 4) were assigned to various coordination modes of fluorine within the anatase network. The peak centered at −85 ppm was assigned to a fluorine coordinated to three titanium ions. The most intense peak located near 0 ppm is characteristic of bridging fluorine and thus was attributed to fluoride ions located near one vacancy. Finally, the broad signal detected at around 90 ppm was assigned to fluoride ions located near two vacancies, i.e. 1-fold coordinated. From the relative intensity, it was concluded that fluoride ions preferentially adopted a 2-fold coordination, i.e. neighboring one vacancy.

Synchrotron diffraction was further used to obtain crystallographic data of the sample. The results were compared to those of a fluorine-free TiO$_2$ compound and are summarized in Table 1.

TABLE 1

Structural parameters obtained by analysis of diffraction data.

|   | TiO$_2$ | Ti$_{0.78}$□$_{0.22}$O$_{1.12}$F$_{0.4}$(OH)$_{0.48}$ |
|---|---|---|
| a (Å) | 3.7695(5) | 3.784(1) |
| c (Å) | 9.454(2) | 9.448(6) |
| V (Å$^3$) | 134.33(4) | 135.28(10) |
| d$_{Ti-O/F}$ (Å) | 2*1.972(3) | 2*1.984(6) |
|  | 4*1.925(1) | 4*1.929(1) |
| Ti (4a) occupancy | 1.00(1) | 0.74(4) |

Both compounds showed close unit cell parameters and inter-atomic distances values. Refining the rate occupancy of the fluorine-free TiO$_2$ led to a 100% rate occupancy confirming the stoichiometric composition. On the other hand, the fluorinated compound exhibits 78% of Ti (4a) occupancy rate. Thus, the combination of various techniques including thermal and elemental analyses allow to determine the chemical composition of the sample prepared in this example to be Ti$_{0.78}$□$_{0.22}$F$_{0.4}$(OH)$_{0.48}$O$_{1.12}$.

Example 2

Figure 5:
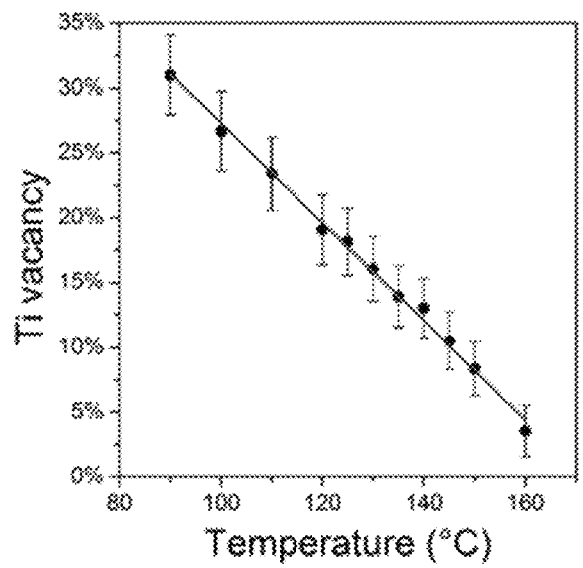
FIG. 5 shows the correlation between the synthesis temperature and the chemical composition of $Ti_{1-x-y}\square_{x+y}O_{2-4(x+y)}F_{4x}(OH)_{4y}$. The Ti (4a) site occupancy was determined by structural analysis of diffraction data.

The content of cationic vacancies in Ti$_{1-x-y}$□$_{x+y}$F$_{4x}$(OH)$_{4y}$O$_{2-4(x+y)}$ can be controlled synthetically. Various cationic concentrations were obtained by tuning the reaction temperature in the conditions of Example 1, Solutions containing 13.5 mmol of titanium isopropoxide (4 mL) and 27 mmol of aqueous HF (40%) in 25 mL of isopropanol, placed in sealed containers, were treated at different temperatures ranging from 90 to 160° C. for 12 hours. The content in cationic vacancies for the prepared samples was determined by diffraction data analysis. The results displayed in FIG. 5 showed a linear variation of the cationic content as a function of the reaction temperature.

Example 3

Ti$_{0.78}$□$_{0.22}$F$_{0.4}$(OH)$_{0.48}$O$_{1.12}$ prepared according to example 1 was tested in a Li/Ti$_{0.78}$□$_{0.22}$F$_{0.4}$(OH)$_{0.48}$O$_{1.12}$ cell. The electrochemical cell is composed of a positive electrode, a negative electrode, and a non-aqueous electrolyte. The positive electrode consisted of a mixture of 80 wt % Ti$_{0.78}$□$_{0.22}$F$_{0.88}$O$_{1.12}$ powder, 10 wt % carbon, and 10 wt % PVDF binder, coated on a copper foil. The negative electrode was metallic lithium and served as reference. An LP30 commercial solution was used as the non-aqueous electrolyte. It contains LiPF$_6$ dissolved in a mixture of ethylene carbonate (EC) and di-methyl carbonate (DMC) solvents.

Figure 6:
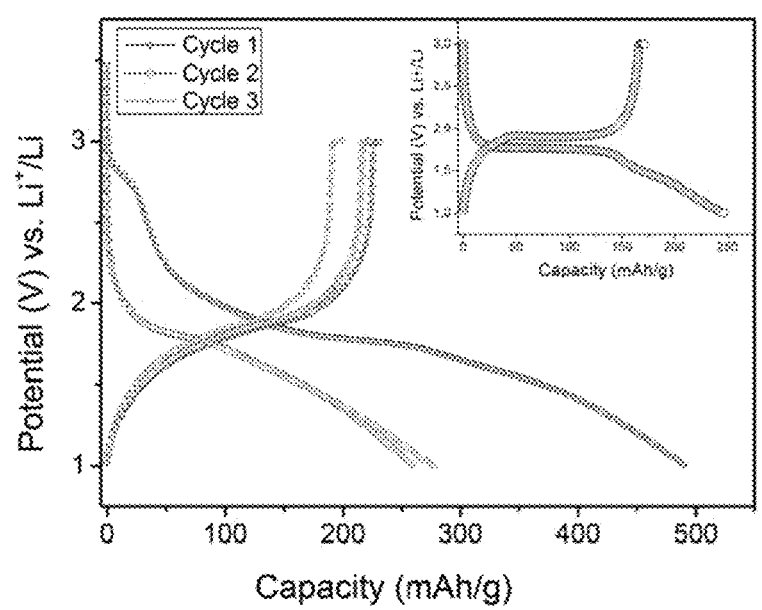
FIG. 6 shows the potential vs. capacity of a $Li/Ti_{0.78}\square_{0.22}F_{0.40}(OH)_{0.48}O_{1.12}$ cell cycled between 1 and 3V under 20 mA/g. Inset: Voltage profile of a $Li/TiO_2$ cell.

FIG. 6 shows the potential versus capacity curves of a Li/Ti$_{0.78}$□$_{0.22}$F$_{0.4}$(OH)$_{0.48}$O$_{1.12}$ cell under 20 mA/g for the three first cycles. The voltage window was set between 1 to 3V. The first discharge capacity exceeded by far the theoretical capacity, reaching 490 mAh/g. A large irreversible capacity is observed upon charging, with a charge capacity reaching 230 mAh/g. Such a phenomenon is commonly observed for nanosized titanium based materials and is ascribed to lithium reacting with surface species (H$_2$O, OH groups, etc). The striking point here is the shape of the discharge (reduction) and charge (oxidation) curves exhibiting a continuous evolution of the potential versus capacity, which indicates that the fluorinated anatase Ti$_{0.78}$□$_{0.22}$F$_{0.4}$(OH)$_{0.48}$O$_{1.12}$ inserts lithium topotactically in a one-phase process, i.e. a solid solution behavior. This is in contrast with TiO$_2$ anatase that inserts lithium in a two-phase process (first order transition) according to a tetragonal (I4$_1$/amd) to orthorhombic (Imma) phase transition characterized by the presence of a Li-plateau at 1.78V (inset in FIG. 6).

Figure 7:
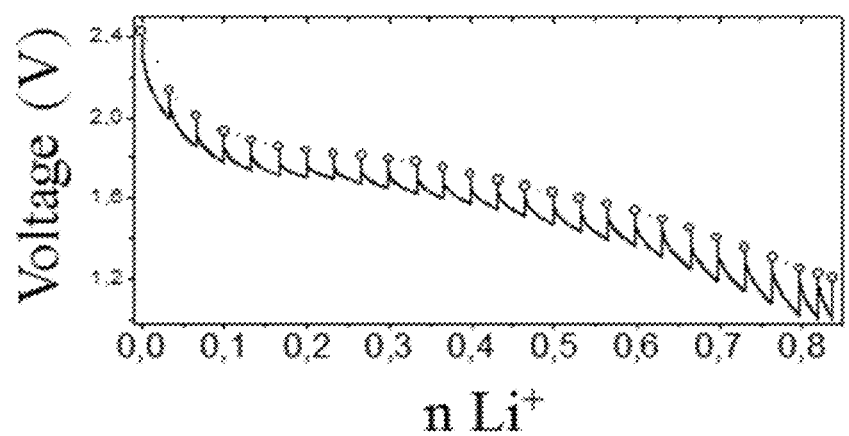
FIG. 7 shows the quasi-equilibrium voltage obtained by the galvanostatic intermittent titration technique. The $Li/Ti_{0.78}\square_{0.22}F_{0.40}(OH)_{0.48}O_{1.12}$ cell was intermittently discharged at a C-rate of C/10 (315 mA/g) for 20 min followed by 20 hours of relaxation. The x-axis refers to the number of Li ions inserted into $Ti_{0.78}\square_{0.22}F_{0.40}(OH)_{0.48}O_{1.12}$ electrode.

To confirm that the reaction with lithium proceeds via a solid solution behavior, the quasi-equilibrium voltage (FIG. 7) was obtained by the galvanostatic intermittent titration technique (GITT). The GITT graph shows a smooth curve emphasizing that lithium is inserted in the Ti$_{0.78}$□$_{0.22}$F$_{0.4}$(OH)$_{0.48}$O$_{1.12}$ via a solid solution behavior.

Figure 8:
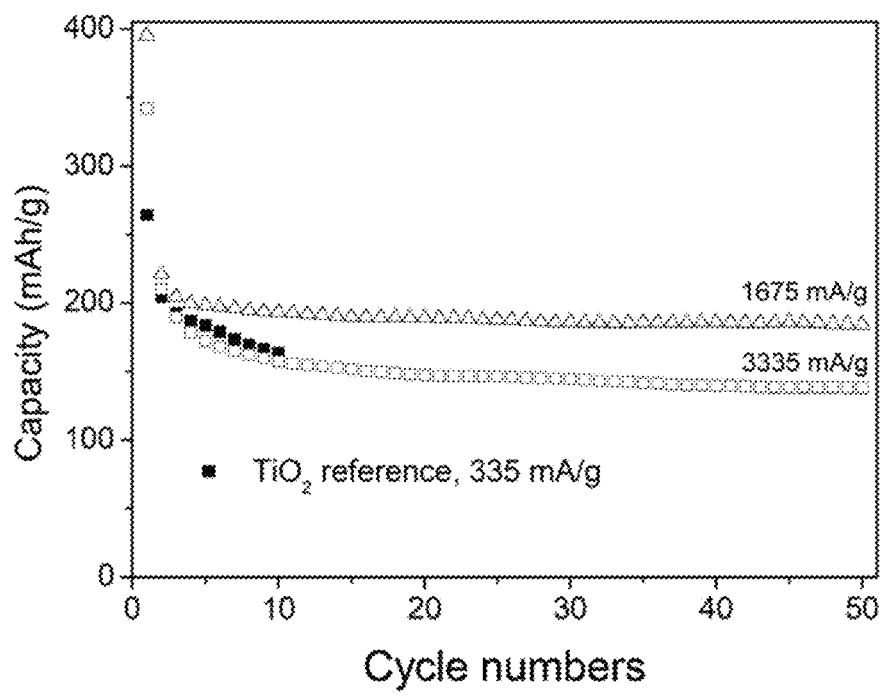
FIG. 8 shows the rate capacity of a $Li/Ti_{0.78}\square_{0.22}F_{0.40}(OH)_{0.48}O_{1.12}$ cell. For comparison purposes, data obtained for a $Li/TiO_2$ cell under 335 mA/g are also indicated.

FIG. 8 shows the evolution of the capacity as a function of cycle numbers for a Li/Ti$_{0.78}$□$_{0.22}$F$_{0.88}$O$_{1.12}$ cell. Excellent capacity retention was obtained under high current density. The Li/Ti$_{0.78}$□$_{0.22}$F$_{0.88}$O$_{1.12}$ cell can indeed sustain a capacity of 135 mAh/g after 50 cycles under 3335 mA/g. This corresponds to discharging 135 mAh/g in 4 minutes, which is equivalent to a 15 C rate. For comparison purposes, the Li/TiO$_2$ cell cycled under 335 mA/g reached 165 mAh/g after 10 cycles, showing the superior rate capability of the fluorinated anatase over the fluorine-free sample.

Numerous modifications could be made to any one of the above-described embodiments without departing from the scope of the invention as contemplated. References, patents or scientific literature documents mentioned in the present application are incorporated herein by reference in their entirety for all purposes.

The invention claimed is:

1. A titanium-based compound of the general chemical formula:

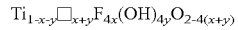

Ti$_{1-x-y}$□$_{x+y}$F$_{4x}$(OH)$_{4y}$O$_{2-4(x+y)}$ wherein,
□ represents a cationic vacancy; and
x and y are numbers such that 0.01≤(x+y)<0.5, wherein x and y are not zero, and wherein the titanium-based compound has an anatase type structure.

2. The titanium-based compound according to claim 1, wherein x and y are numbers such that 0.04≤(x+y)<0.5.

3. The titanium-based compound according to claim 1, which is $Ti_{0.78}\square_{0.22}F_{0.4}(OH)_{0.48}O_{1.12}$.

4. An electrochemically active material comprising the titanium-based compound of claim 1.

5. An electrode comprising the electrochemically active material of claim 4 on a current collector.

6. A lithium-ion battery comprising the electrode of claim 5, a counter-electrode and an electrolyte between the electrode and the counter-electrode.

7. A method for preparing a titanium-based compound having an anatase type structure with cationic vacancies arising from a partial substitution of oxygen atoms by fluorine atoms and hydroxyl groups, comprising the steps of:
a) preparing a solution containing a titanium precursor, a fluorinating agent and a solvent; and
b) precipitating a titanium-based compound having the general chemical formula $Ti_{1-x-y}\square_{x+y}F_{4x}(OH)_{4y}O_{2-4(x+y)}$, wherein represents a cationic vacancy, wherein x and y are numbers such that 0.01≤(x+y)<0.5, and wherein x and y are not zero.

8. The method according to claim 7, wherein the titanium precursor is selected from titanium $C_2$-$C_{10}$ alkoxides and titanium chloride.

9. The method according to claim 7, wherein the fluorinating agent is an agent which provides fluoride anions.

10. The method according to claim 7, wherein the solvent of the solution of step (a) comprises an organic solvent or a mixture of an organic solvent and water.

11. The method according to claim 10, wherein the organic solvent is selected from $C_1$-$C_{10}$ alcohols, dialkylketones, ethers, esters or a combination thereof.

12. The method according to claim 10, wherein the organic solvent is methanol, ethanol, isopropanol, butanol, octanol or a combination thereof.

13. The method according to claim 7, wherein step (a) or (b) further comprises a thermal treatment.

14. The method according to claim 13, wherein the thermal treatment comprises heating the solution of step (a) at a temperature within the range of from about 50° C. to about 220° C.

15. The method of claim 13, wherein a degree of cationic vacancies is controlled by adjusting the temperature of the thermal treatment.

16. The method according to claim 11, wherein the dialkylketones are acetone.

17. The method of claim 7, wherein x and y are numbers such that 0.04≤(x+y)<0.5.

18. A titanium-based compound prepared by the process method according to claim 7, wherein said compound is of the general chemical formula:

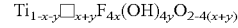
$$Ti_{1-x-y}\square_{x+y}F_{4x}(OH)_{4y}O_{2-4(x+y)}$$

wherein,
□ represents a cationic vacancy; and
x and y are numbers such that 0.01≤(x+y)<0.5, and wherein x and y are not zero.

* * * * *